United States Patent [19]
Peek et al.

[11] 4,208,634
[45] Jun. 17, 1980

[54] CIRCUIT FOR SUPPRESSING NOISE CAUSED BY SCRATCHES ON A PHONOGRAPH RECORD

[75] Inventors: Johannes B. H. Peek; Johan M. Schmidt, both of Eindhoven, Netherlands

[73] Assignee: U.S. Philips Corporation, New York, N.Y.

[21] Appl. No.: 949,917

[22] Filed: Oct. 10, 1978

[30] Foreign Application Priority Data

Nov. 15, 1977 [NL] Netherlands ............... 7712536

[51] Int. Cl.² .................................. H03F 1/26
[52] U.S. Cl. ........................ 330/149; 179/1 P; 179/100.4 A; 330/124 R
[58] Field of Search .......... 179/1 D, 1 P, 100.4 A; 330/149; 360/67, 68

[56] References Cited

U.S. PATENT DOCUMENTS

| 3,593,334 | 7/1971 | Bickel | 360/67 X |
| 3,803,357 | 4/1974 | Sacks | 179/1 D X |
| 4,143,333 | 3/1979 | Jacobsen et al. | 330/149 |

FOREIGN PATENT DOCUMENTS 2310192  9/1974  Fed. Rep. of Germany ... 179/100.4 A X

OTHER PUBLICATIONS

Wright—"Use Slew-Rate Filtering"—*Electronics Design* pp. 110–112, Sep. 13, 1976.

*Primary Examiner*—James B. Mullins
*Attorney, Agent, or Firm*—Thomas A. Briody; William J. Streeter; Edward W. Goodman

[57] ABSTRACT

A circuit for suppressing pulse-shaped interferences in an audio signal caused by scratches on a phonograph disc, comprising a signal processing section connected between an audio frequency input and an audio frequency output, comprising a noise suppressor having a control input; as well as a control signal section connected between the audio frequency input and the control input, said control signal section comprising a first threshold selection circuit connected to the audio frequency input for selecting pulse-shaped signals from the audio signal, followed by a second threshold selection circuit for distinguishing the pulse-shaped signals originating from noise signals from those originating from musical signals.

8 Claims, 5 Drawing Figures

CIRCUIT FOR SUPPRESSING NOISE CAUSED BY SCRATCHES ON A PHONOGRAPH RECORD

BACKGROUND OF THE INVENTION

The invention relates to a circuit for suppressing pulse-shaped interferences in an audio signal caused by scratches on a phonograph recording, comprising, arranged between an audio frequency input and an audio frequency output, a signal processing section, provided with a noise suppressor having a control input, as well as a control signal section arranged between the audio frequency input and the control input, the control signal portion comprising a first threshold selection circuit connected to the audio frequency input for selecting pulse-shaped signals from the audio signal.

Such a circuit is disclosed in the article "Audio disc scratch filter" by M. R. Sachs and J. M. Bullingham, published in "Electronics Letters" dated Dec. 9, 1976, vol. 12, no. 25, pages 656–657.

In the prior art circuit the occurrence of noise caused by a scratch on the phonograph record is detected in the first threshold selection circuit by means of a high-pass filter, a level control circuit and a detector.

In some fragments of music recorded on a phonograph record, in which certain musical instruments have the upperhand, such as, for example, percussion instruments, and brass wind instruments, there are, however, pulse-shaped music signals which are very similar to noise caused by scratches on the phonograph record. These pulse-shaped music signals follow one another in a fast rhythm during such a fragment of music and the detector in the first threshold selection circuit recognizes them as a rapid, continuous succession of interferences. Consequently the noise suppressor may be actuated consecutively and rapidly, which may result in an annoying distortion of the output signal of the circuit.

SUMMARY OF THE INVENTION

It is an object of the invention to obviate this drawback. According to the invention, a circuit of the type defined in the preamble is therefore characterized in that a second threshold selection circuit is arranged between the first threshold selection circuit and the control input of the noise suppressor for selecting the pulse-shaped interferences from the pulse-shaped signals of the first selection circuit. This second threshold selection circuit comprises therefore a converter arranged between the first threshold detection circuit and a noise detector having a threshold, this converter converting a pulse frequency into a d.c. voltage for varying, depending on the pulse frequency, the ratio between the amplitude of the pulse-shaped signals of the first selection circuit and the threshold voltage of the noise detector.

The invention is based on the recognition that the time intervals between the pulse-shaped music signals during the relevant fragments of music are generally a few times smaller than those between the separately occurring pulse-shaped interferences caused by scratches on the phonograph record. If the pulse-shaped signals of the first threshold selection circuit are produced with a high pulse frequency, these signals are, in general, music signals. However, if they occur, occasionally, in other words with a low pulse frequency, these signals are, in general, noise signals which must be suppressed.

The circuit according to the invention utilizes this fact. The d.c. voltage of the converter represents the pulse frequency of the pulse-shaped signals of the first threshold selection circuit. By means of this d.c. voltage the threshold voltage of the noise detector or the amplitude of the pulse-shaped signals can be varied so that only the individually occurring pulse-shaped signals can pass the threshold voltage and, consequently, activate the noise detector. Thus the output signal of the noise detector only represents noise caused by scratches on the phonograph record.

A preferred embodiment of such a circuit according to the invention is characterized in that the d.c. voltage of the converter changes, for a pulse frequency of at least 120 Hz lasting at least 15 msec., from a quiescent level to an operating level and, if pulse-shaped signals are not produced during at least substantially 200 msec., the d.c. voltage changes exponentially from the operating level to the quiescent level, the noise detector having a maximum insensitivity to pulse-shaped signals at said operating level and the noise detector being activated at said quiescent level by the occurrence of a pulse-shaped signal.

The degree to which the noise suppression is perceptible increases with the frequency. Perception tests have shown that this perceptibility becomes annoying if noise suppressions are effected during a certain period of time with a frequency of 5 Hz or higher, that is to say if they follow one another with time intervals of less than 200 msec.

Furthermore it appeared that 5 or more pulse-shaped signals, occurring at the same time with a pulse repetition rate exceeding 5 Hz and, in particular, exceeding 120 Hz, are substantially never caused by noise but, on the contrary by desired music signals.

When applying the measures according to the invention, the noise detector is brought from an operating condition in which the noise detector can be activated by a pulse-shaped signal, to a maximum insensitivity to pulse-shaped signals within 15 msec by means of the d.c. voltage of the converter by a rapid succession of pulse-shaped signals having a pulse frequency equal to or exceeding 120 Hz, which may originate from, for example, trumpets or percussion instruments. The ratio between the threshold voltage of the noise detector and the amplitude of the pulse-shaped signals is then adjusted so that normally prevailing noise and music pulses cannot pass the threshold voltage. Interferences then occurring do not activate the noise detector and are, consequently, not suppressed. In practice such interferences will be hardly perceptible among the pulse-shaped music signals.

During such fragments of music it is, however, possible that interferences are produced which cause such great amplitude variation that the threshold voltage of the noise detector is passed and the detector is, consequently, activated. Several interferences like these, which would also be audible during the relevant fragment of music are, in contradistinction to the smaller hardly perceptible interferences, suppressed.

Approximately 200 msec after such a fragment of music the noise detector is again in the operating condition. A pulse-shaped signal then occurring activates the noise detector and, consequently, the noise suppressor and is suppressed.

A further preferred embodiment of such a circuit according to the invention is characterized in that the second threshold selection circuit comprises, arranged between the first threshold selection circuit and the converter, a monostable multivibrator having a time constant of at least substantially 2 msec and in that the converter comprises a capacitor which is coupled via a series arrangement of a diode and a charging resistor to the monostable multivibrator, the RC-time of the capacitor and the charging resistor being at least substantially 5 msec, the capacitor being shunted by a discharging resistor and forming an RC-time therewith of at least substantially 100 msec.

When using this circuit according to the invention, the pulse-shaped signals of the first threshold selection circuit are first standardized in the monostable multivibrator and thereafter added by means of the capacitor. The standardization has the advantage that the pulse frequency d.c. voltage conversion is independent of the form of the pulse-shaped signals. For the specified values for the time constant of the monostable multivibrator and the RC-time of the capacitor and the charging resistor, the noise detector is sufficiently rapidly brought to a maximum insensitivity to prevent an unnecessarily long suppression of music signals. For said value for the RC-time constant of the capacitor and the discharge resistor, the noise detector is brought sufficiently rapidly to the operating condition again to be able to suppress annoying, perceptible noise.

A further preferred embodiment of a circuit according to the invention is characterized in that an output of the converter is connected to the base of a transistor of the noise detector, which converter, for pulse-shaped signals, is shunted by a connecting lead.

When using this measure according to the invention, the threshold voltage of the noise detector is varied by the d.c. voltage of the converter by adding this d.c. voltage to the base-emitter bias voltage of the transistor of the noise detector. To this end the d.c. voltage is applied in the present implementation to the base of this transistor. Depending on the shunt either the pulse-shaped signals of the first selection circuit of the standardized pulses of the monostable multivibrator are also applied to the base via the connecting lead. By increasing the d.c. voltage and, consequently the base-emitter bias voltage of the transistor in the case of an increasing pulse frequency the pulse-shaped music signals applied via the connecting lead cannot render the transistor conductive. On the other hand, owing to the low pulse frequency, the pulse-shaped interferences do substantially not increase the d.c. voltage so that they can render the transistor conductive via the connecting lead.

A still further preferred embodiment of a circuit according to the invention in which the first selection circuit comprises a level control circuit as well as a detector connected thereto, is characterized in that the detector has a threshold voltage and the level control circuit comprises a RC-control network having a time constant of at least substantially 3 msec for controlling, in a mutual constant ratio, the dynamic range of the audio signal and the threshold voltage of the detector.

When using this measure according to the invention the pulse-shaped signals are separated in the first threshold selection circuit from the amplitude variations owing to the dynamic range of the audio signals. With said time constant of the RC-control network, the output signal thereof gives an acceptable representation of the dynamic range of the audio signal. This output signal can be used to vary the threshold voltage of the detector or the amplitude of the disturbed audio signal in such a manner that only pulse-shaped signals pass the threshold voltage of the detector. The output signal of the detector therefore represents only pulse-shaped signals which can either be desired music signals or unwanted interferences.

A further preferred embodiment of such a circuit according to the invention is characterized in that the level control circuit comprises a dynamic compressor which includes the RC-control network, for minimizing the amplitude variations of the audio signal owing to the dynamic and in that the threshold voltage of the detector has a constant value.

A compression of the disturbed audio signal is effected in the dynamic compressor such that the amplitude variations owing to the dynamic range are adjusted to substantially one signal level, while the pulse-shaped amplitude variations remain recognizable. They are selected by adjusting the threshold voltage of the detector to a constant value, as close as possible to said signal level, so that only said pulse-shaped amplitude variations can pass the threshold voltage.

A still further preferred embodiment of such a circuit according to the invention for suppressing pulse-shaped noise in a stereo signal owing to scratches on a stereo phonograph disc, the audio frequency input comprising first and second input terminals and the audio frequency output first and second output terminals and wherein the control signal section comprises a differential amplifier connected to the two input terminals, one output being coupled to a signal input of the level control circuit, is characterized in that the control signal section also comprises a sum amplifier, one end of which is connected to the two input terminals and the other end to a control input of the level control circuit.

In practice scratches on a stereo phonograph disc mainly disturb the vertical groove modulation. This vertical groove modulation corresponds to the difference signal of the left-hand and right-hand audio signal of the stereo signal recorded on the disc. Consequently, this difference signal is eminently suitable for detecting noise signals caused by scratches. The above-mentioned article discloses this use of the difference signal.

In practice such scratches disturb the horizontal groove modulation to a much lesser extent. The horizontal groove modulation corresponds to the sum signal of the left-hand and the right-hand audio signal. This sum signal represents the dynamic range of the stereo signal, the amplitude of the noise signals present therein owing to scratches being much smaller than that of the noise signals in the difference signal. Consequently, the sum signal can be used with much advantage for detecting the dynamic range of the stereo signal.

When using the measure according to the invention, the interferences affect the control signal, derived from the sum signal and obtained in the RC-control network coupled to the control input, to a limited degree only so that the amplitude variations of the output signal of the dynamic compressor which are the result of the dynamic range of the stereo signal are substantially smoothed and those resulting from interferences have remained recognizable.

A still further preferred embodiment of such a circuit according to the invention is characterized in that the level control circuit comprises, arranged between the signal input and the thresholded detector, a first controllable amplifier, and a second controllable amplifier, connected to the control input, the second controllable amplifier being negatively fed back from an output terminal to a control input terminal via a full-wave rectifier and the RC-control network, the control input terminal of the second controllable amplifier being connected to a control input terminal of the first controllable amplifier.

When using this measure according to the invention the amplitude variations in the difference signal owing to the dynamic of the stereo signal are controlled to one signal level in the first controllable amplifier. The control signal required for this control and in which the dynamic range of the stereo signal should be represented is obtained from the sum signal by means of the second controllable amplifier which is negatively fed back to a high degree. If the amplitude of the sum signal increases owing to the dynamic range thereof, such a control signal is then formed in the RC-control network that the gain of the second controllable amplifier is reduced and vice versa. Via the control input terminal of the first controllable amplifier this control signal controls the amplitude variations resulting from said dynamic in the difference signal to one signal level.

BRIEF DESCRIPTION OF THE DRAWINGS

The invention will be further explained with reference to the figures shown in the drawing. Herein:

FIG. 1 shows a circuit according to the invention having a signal processing section 9, arranged between input terminals 1 and 2 and output terminals 3 and 4 and a control signal section 10 included in a forward control loop. The signal processing section 9 comprises two identical parallel signal paths, each signal path comprising a cascade arrangement of pre-amplifiers 5 and 6, connected to the input terminals 1 and 2 respectively, delay circuits 7a and 7b and controlled amplifiers 8a and 8b being connected to the output terminals 3 and 4. The delay circuits 7a and 7b and the controlled amplifiers 8a and 8b constitute a delay unit 7 and a noise suppressor 8, respectively.

Figure 1:
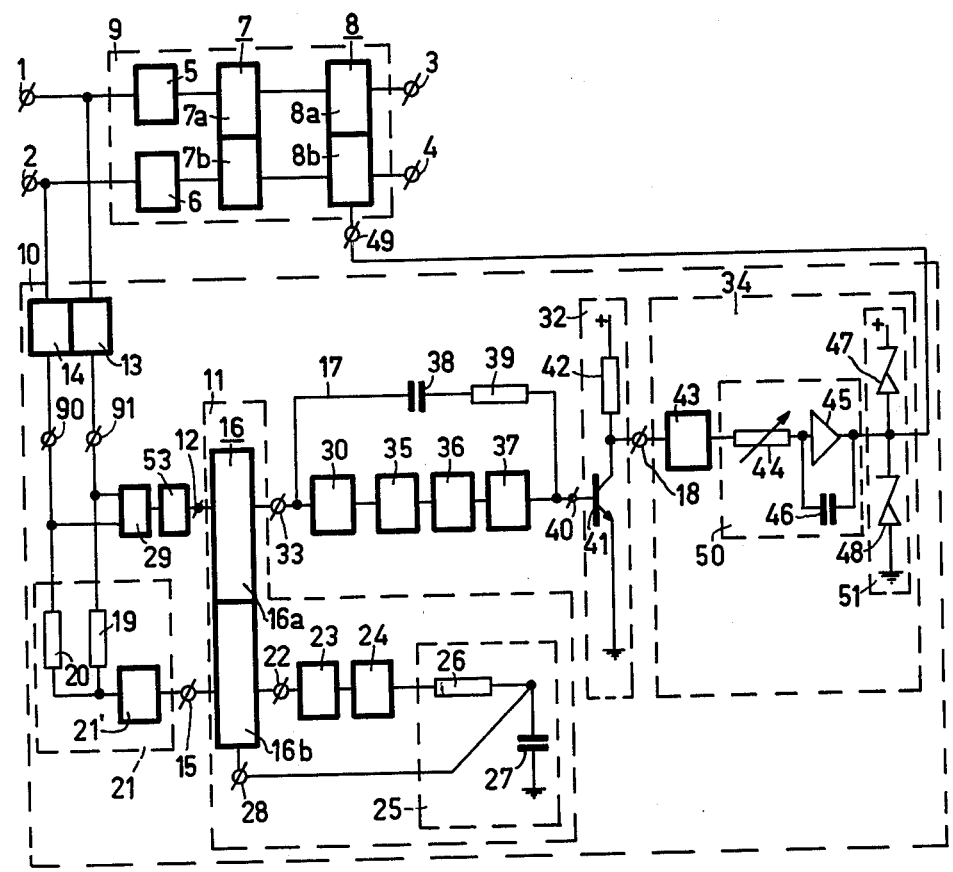
FIG. 1 shows an embodiment of a circuit in accordance with the invention.

The control signal section 10 comprises pre-amplifiers 13 and 14, connected to the input terminals 1 and 2, respectively, a differential amplifier 29 connected to the outputs of the pre-amplifiers 13 and 14, as well as a sum amplifier 21' which is also connected to those outputs via the respective resistors 19 and 20 of a signal adder circuit 21. The differential amplifier 29 is coupled via a differentiator 53 to a signal input 12 of a dynamic compressor 11, the sum amplifier 21' being coupled to a control input 15 thereof. An output 33 of the dynamic compressor 11 is coupled via amplifiers 30 and 35 to a monostable multivibrator 36. The amplifier 30 has a fixed voltage threshold. The monostable multivibrator 36 is connected to a converter 37, which converts a pulse frequency into a d.c. voltage. The converter 37 (together with the amplifiers 30 and 35 and the monostable multivibrator 36) is shunted by a series arrangement of a coupling capacitor 38 and a resistor 39, arranged in a connecting lead 17. The output 33 of the dynamic compressor 11 is coupled to an input 40 of a noise detector 32 via the connecting lead 17. The converter 37 is also coupled to the input 40. An output 18 of the noise detector 32 is coupled to a function generator 34. An output of the function generator 34 is connected to a control input 49 of the noise suppressor 8.

The left-hand and the right-hand audio signals (L and R respectively) of an audio frequency stereo signal recorded on a phonograph disc, which signals originate from a scanning element, not shown, of, for example, a phonograph, are applied separately to the input terminals 1 and 2. In the signal processing section 9 these audio signals are first amplified to the same extent by means of the pre-amplifiers 5 and 6, thereafter delayed in delay unit 7 for an equal period of time and, finally, the noise is removed in the noise suppressor 8 by suppressing a signal during the occurrence of noise caused, for example, by a scratch on the phonograph disc. The control signal for such a noise suppression is applied to the noise suppressor 8 via the control input 49. This control signal is supplied by the control signal section 10 after noise has been detected in the audio signals L and R applied to the input terminals 1 and 2.

The disturbed stereo signal does not only have amplitude variations owing to the dynamic but also pulse-shaped amplitude variations superimposed thereon which are of a considerably shorter duration than the first-mentioned amplitude variations. These amplitude variations may be caused by noise resulting from, for example, scratches on the phonograph record and are, therefore, unwanted. They may, however, also originate from musical instruments such as, for example, trumpets or percussion instruments. In that case they are desired. The desired and the unwanted pulse-shaped amplitude variations will be called music pulses and noise pulses, respectively, in the further course of this description.

Noise pulses are detected in two selection stages.

In the first selection stage the pulse-shaped amplitude variations, that is to say the noise and music pulses, are separated from the amplitude variations caused by the dynamic range. In the second selection stage the noise pulses are separated from the music pulses. Use is made of the fact that the time intervals between the noise pulses are generally much larger than those between the music pulses.

The first selection can be effected by means of an amplifier having a threshold, which amplifier amplifies only those signals whose amplitude exceeds a given threshold voltage. It is possible to have this threshold voltage vary with the dynamic range of the stereo signal, with a certain slowness, so that only the pulse-shaped amplitude variations superimposed thereon exceed the threshold voltage. It is alternatively possible to assign a fixed value to the threshold voltage and to compress the disturbed stereo signal with a certain delay in such a manner that only the amplitude-variations superimposed on the dynamic exceed this fixed threshold value.

The circuit shown in this figure utilizes the latter possibility for said first selection. The starting point is the difference signal L-R formed in the differential amplifier 29. The article "Audio disc scratch filter" by M. R. Sachs and J. M. Bullingham, published in Electronics Letters dated Dec. 9, 1976, vol. 12, pages 656 and 657 describes that the difference signal L-R of a stereo signal originating from a phonograph disc is eminently suitable for detecting noise caused by scratches in the relevant disc.

In the present circuit difference signal L-R is first differentiated in the differentiator 53. This increases the amplitude of the music and noise pulses relative to the amplitude-variations owing to the dynamic of the stereo signal. In a practical implementation the differentiator has to this end a time constant of 0.14 msec.

Thereafter the difference signal L-R is compressed in a controllable amplifier 16a of the dynamic compressor 11. The control signal required for the compression should be a representation of the dynamic range of the undisturbed stereo signal. An acceptable approximation of the dynamic range of the undisturbed stereo signal is the sum signal L+R, because therein the noise pulses are much smaller relative to the remaining music signals than in each of the signals L, R and L−R.

The sum signal L+R is formed in the signal adder circuit 21 and applied to a controllable amplifier 16b, of the dynamic compressor 11 which controllable amplifier 16b is negatively fed back to a high degree. The negative feedback of the controllable amplifier 16b is constituted by a cascade arrangement, arranged between an output 22 and a control input terminal 28, of an amplifier stage 23, a full-wave rectifier 24 and a smoothing filter 25, which filter functions as an RC-control network. The time constant of the smoothing filter 25 has been chosen so large that the brief, pulse-shaped amplitude variations, that is to say the noise and music pulses, cannot be followed. The control signal applied to the control input 28 therefore represents fairly accurately the dynamic range of the stereo signal and, in the case of an increasing or decreasing amplitude of the sum signal, controls the gain of the two amplifiers 16a and 16b to a lower or higher gain. Consequently, both the loud and soft audio fragments in the difference signal L−R are controlled to substantially the same amplitude level. Because the noise and music pulses are substantially absent from the control signal, they are not eliminated from the difference signal L−R and are, consequently retained.

After this dynamic compression the difference signal L−R is fed to an amplifier 30, having a threshold, and functioning as the first threshold selection circuit, in which said first selection of the music and the noise pulses from the difference signal L−R is effected. To this end the threshold voltage of this amplifier 30, having a threshold, is chosen so that only music and noise pulses can exceed this threshold voltage. They activate a monostable multivibrator 36 via an amplifier 35.

The second selection, namely the distinguishing between the noise and the music pulses is based on the fact that, in general, noise pulses occur alone and musical pulses in series of five or more pulses with a pulse rate of approximately 120 Hz or higher. The pulse rate of the output pulses of the monostable multivibrator 36 consequently comprises information regarding the type of pulse. In the converter 37 this pulse rate is converted into a negative d.c. voltage. In a practical implementation the converter 37 has such a charge time constant that the d.c. voltage attains a maximum negative value for a series of five pulses or more within a period of 20 msec and such a discharge time constant that the d.c. voltage, in case pulses do not occur for 200 msec, exponentially decreases from the maximum value to a minimum value.

Just as the first selection, also the second selection can be realized by means of an amplifier having a threshold, which amplifies only those signals whose amplitude exceeds a certain threshold voltage. This threshold value may be of a fixed value. In that case it is possible to increase in a controllable amplifier, using the d.c. voltage of the converter 37 as the control signal, first the noise pulses in the output signal of the dynamic compressor 11 or the monostable multivibrator 36 relative to the musical pulses present in this output signal and to pass thereafter these noise and musical pulses to the amplifier having a fixed voltage threshold. The threshold voltage of the amplifier having a threshold must be chosen to have a value located between the amplitude value of the noise pulses and that of the musical pulses.

Alternatively, it is also possible to vary the threshold voltage with the d.c. voltage of the converter 30 and to apply the noise and musical pulses such as they occur in the output signal of the dynamic compressor 11 or the monostable multivibrator 36 directly to this amplifier having a variable threshold. This selection method is performed in the present circuit. The d.c. voltage of the converter 37 is applied via the input 40 of the noise detector 32 to the base of a transistor 41, which functions as an amplifier having a threshold, in the noise detector 32. Also the difference signal L−R of the output of the dynamic compressor 11 is applied to the input 40 via the connecting lead 17. The emitter of transistor 41 is connected to ground, its collector is connected to a collector resistor 42 and also to an output 18.

The threshold voltage of the transistor 41 is determined by its base-emitter bias voltage. This voltage is increased when the negative value of the d.c. voltage of the converter 37 increases. The music pulses which are applied on the one hand to the base of the transistor 41 via the connecting lead 17 produce, on the other hand, such a negative d.c. voltage at the output of the converter 37 that they cannot make transistor 41 conductive. Noise pulses, on the contrary, produce substantially no negative d.c. voltage at the output of the converter 37 so that they do render the transistor 41 conductive via the connecting lead 17. The converter 37 and the noise detector 32 thus function as the second threshold detection circuit.

Noise pulses can, however, also occur during a series of music pulses. Such noise pulses do not render the transistor 41 conductive and are therefore recognized as desired music pulses. In practice, these noise pulses are hardly perceptible during such music signals.

The noise pulses at the output 18 of the noise detector 32 start a monostable multivibrator 43 of the function generator 34. The uniform square-wave output pulses of this monostable multivibrator 43 are integrated to triangular pulses in an integrating network 50 consisting of a series arrangement of a variable resistor 44 connected to the monostable multivibrator 43 and an operational amplifier 45 shunted by a capacitance 46. The slope thereof is determined by the time constant of the variable resistor 44 and the capacitance 46. Limitation of the amplitude of this triangular pulses is effected in a limiter circuit 51 of function generator 34, constituted by a series arrangement of Zener diodes 47 and 48. The common junction of these zener diodes is connected to an output of the integrating network 50 as well as to the control input 49 of the noise suppressor 8. The shape of the control pulses is shown in FIG. 1a wherein the period of time in which the paths a, b and c are passed through can, in practice, be 1 to 2 msec. A maximum suppression of the stereo signal in the noise suppressor 8 is effected during path b. A reduction and increase, in the gain of the stereo signal is effected in the paths a and c, respectively in the controlled amplifiers 8a and 8b of the noise suppressor 8.

The duration of the delay realized in delay unit 7 should be at least equal to the period of time elapsing between detection of an interference and the occurrence of path b in the control pulse derived therefrom.

Figure 1A:
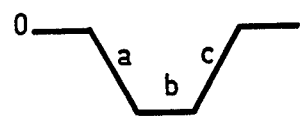
FIG. 1a shows an embodiment of a control pulse for suppressing the stereo signal when an interference occurs in the circuit according to FIG. 1.

In a circuit, as shown in FIG. 1, tested in practice, the amplifiers 5, 6, 13, 14, 21', 29, 35 and 45 were provided with operational amplifiers of the type TCA 680, the amplifier 30 with a transistor of the type BC 550 and the monostable multivibrators 36 and 43 with an integrated circuit of the type HEF 4528. Delay unit 7 comprised an integrated, digital clock controlled, dual charge transfer store (bucket-brigade delay line) of the type TDA 1022, by means of which, under the control of a clock frequency adjusted between 85 KHz and 170 KHz, a signal delay of between 3 and 1.5 msec per channel could be realized. The noise suppressor 8 as well as the controllable amplifiers 16a and 16b were realized by means of an integrated dual controllable amplifier of the type TCA 730. The transistor 41 was of the type BC 550. The pulse width of the monostable multivibrator 36 was chosen to be 2 msec. that of the monostable multivibrator 43 to be 5 msec.

The integrating network and the limiter circuit 51 were dimensioned so that the paths a and c of the control pulse, shown in FIG. 1a, were approximately 1.5 msec. The delay of delay circuit 7 was also adjusted to 1.5 msec.

Figure 2:
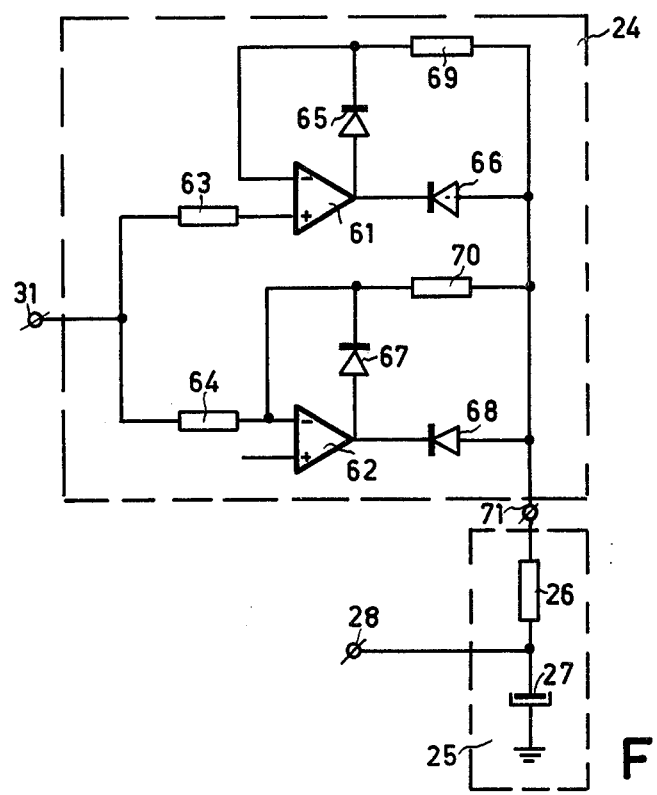
FIG. 2 shows a practical implementation of a full-wave rectifier and a smoothing filter as used in the circuit of FIG. 1.

FIG. 2 shows a detailed preferred embodiment of the full-wave rectifier 24 and the smoothing filter 25, functioning as an RC-control network, in which the elements corresponding to the elements of the circuit according to FIG. 1 have been given the same reference numerals.

The full-wave rectifier 24 comprises operational amplifiers 61 and 62 which are connected by means of the non-inverting and inverting input, respectively, to an input terminal 31 via matching resistors 63 and 64. The operational amplifiers 61 and 62 are both negatively fed back from the output to their respective inverting inputs via diodes 65 and 67, respectively. The cathodes of the diodes 65 and 67 are connected on the one hand to said inverting input and on the other hand to an input 71 of smoothing filter 25 via resistors 69 and 70. The respective outputs of the operational amplifiers 61 and 62 are connected to the cathodes of the diodes 66 and 68 through which they are coupled to the input 71. The non-inverting input of the operational amplifier 62 is connected to a reference voltage.

The smoothing filter 25 comprises a series arrangement of a resistor 26 and a smoothing capacitor 27, connected between the input 71 and ground. The connection between the resistor 26 and the smoothing capacitor 27 is coupled to the control input terminal 28.

When the polarity of the signal at the input terminal 31 is positive relative to the reference voltage and the non-inverting input of the operational amplifier 62, the diode 65 conducts, so that the operational amplifier 61 is negatively fed back to a high degree and its gain is negligibly low. This positive signal appears, more negatively, at the output of the operational amplifier 62. Diode 67 is cut-off and the output voltage, that is to say the inverted positive input signal of the signal input 31 appears at the input 71 of the smoothing filter 25 via the conducting diode 68. Diode 66 is also cut-off so that the output impedance of the operational amplifier 69 does not load the output of operational amplifier 62.

When the polarity of the signal at the input 31 is negative relative to said reference voltage, diode 65 is cut-off and diode 66 becomes conducting. The output signal of the operational amplifier 61, that is to say the negative output signal of the input terminal 31 appears, amplified, via the conducting diode 66 at the input 71 of smoothing filter 25. Diode 67 then conducts so that the operational amplifier 62 is negatively fed back to a high degree and its gain is negligibly low. Diode 68 is cut-off so that the output impedance of the operational amplifier 62 does not load the output of the operational amplifier 61.

So at the input 71 of smoothing filter 25 a signal appears whose amplitude is equal to the difference between the reference voltage at the non-inverting input of the operational amplifier 62 and the amplitude of the full-wave rectified sum signal L+R. This signal increases when the amplitude of the sum signal decreases and vice versa. The signal is smoothed in smoothing filter 25 to form a control signal for the controllable amplifier 16b for which purpose the smoothing filter has a time constant of approximately 3.3 msec. With such a time constant the control signal represents amplitude variations caused by the dynamic range of the stereo signal and does substantially not represent the noise and the music pulses.

In a practical implementation the operational amplifiers 61 and 62 were integrated and of the type TCA 680, the diodes were of the type BAX 13. The reference voltage was 8 volts.

The value of the resistors 63, 64, 69 and 70 was 10 KΩ, the value of the resistor 26 was 3 K 3Ω while the smoothing capacitor 27 had a capacitance of 1 μF.

Figure 3:
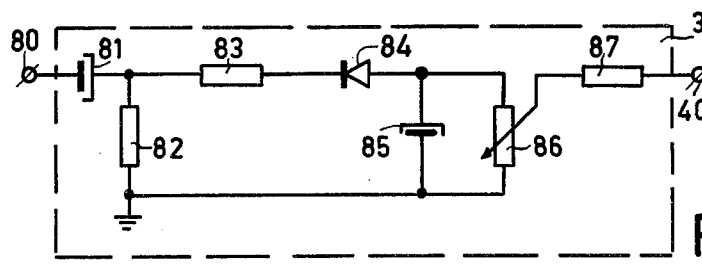
FIG. 3 shows a practical implementation of a converter for converting a pulse frequency into a d.c. voltage as used in the circuit of FIG. 1.

FIG. 3 shows a detailed embodiment of the converter 37 connected between an output 80 of the monostable multivibrator 36 and the input 40 of the noise detector 32.

The converter 37 comprises a series arrangement of a coupling capacitor 81, a resistor 83 and a diode 84, the cathode of which is connected to the resistor 83. The anode of the diode 84 is connected to ground via a parallel RC-member consisting of a capacitor 85 and a potentiometer 86. The wiper of the potentiometer 86 is coupled via a matching resistor 87 to the input 40 of the noise detector 32. The connection between the coupling capacitor 81 and the resistor 83 is connected to ground via a matching resistor 82.

The negative pulses at the output 80 of the monostable multivibrator 36 charge the capacitor 85 negatively via the diode 84 which is conductive for these pulses. This capacitor 85 discharges via the body of potentiometer 86, the RC-time being approximately 0.1 msec. in a practical implementation. The rating of the RC member was chosen so that for a pulse series of 5 to 6 pulses within 20 msec a maximum negative capacitor voltage of approximately 2.2 V is attained. An adjustable portion of the capacitor voltage is tapped off at the wiper of potentiometer 86 and applied as a varying threshold voltage to the input 40 of the noise detector 39 via the matching resistor 87. The setting of the wiper was chosen so, that the threshold voltage attained a minimum value if no pulses had occurred for 20 msec. At this minimum value the noise detector had a maximum sensitivity to pulses.

In this practical implementation the capacitors 81 and 85 had capacitance values of 22 $\mu$F and 1 $\mu$F, respectively. The resistors 82, 83 and 87 had resistance values of 39 k$\Omega$ 5.1 K$\Omega$ and 39 K$\Omega$, respectively. The potentiometer 86 had a maximum value of 100 K$\Omega$. The diode 84 was of the type BAX 13.

Figure 4:
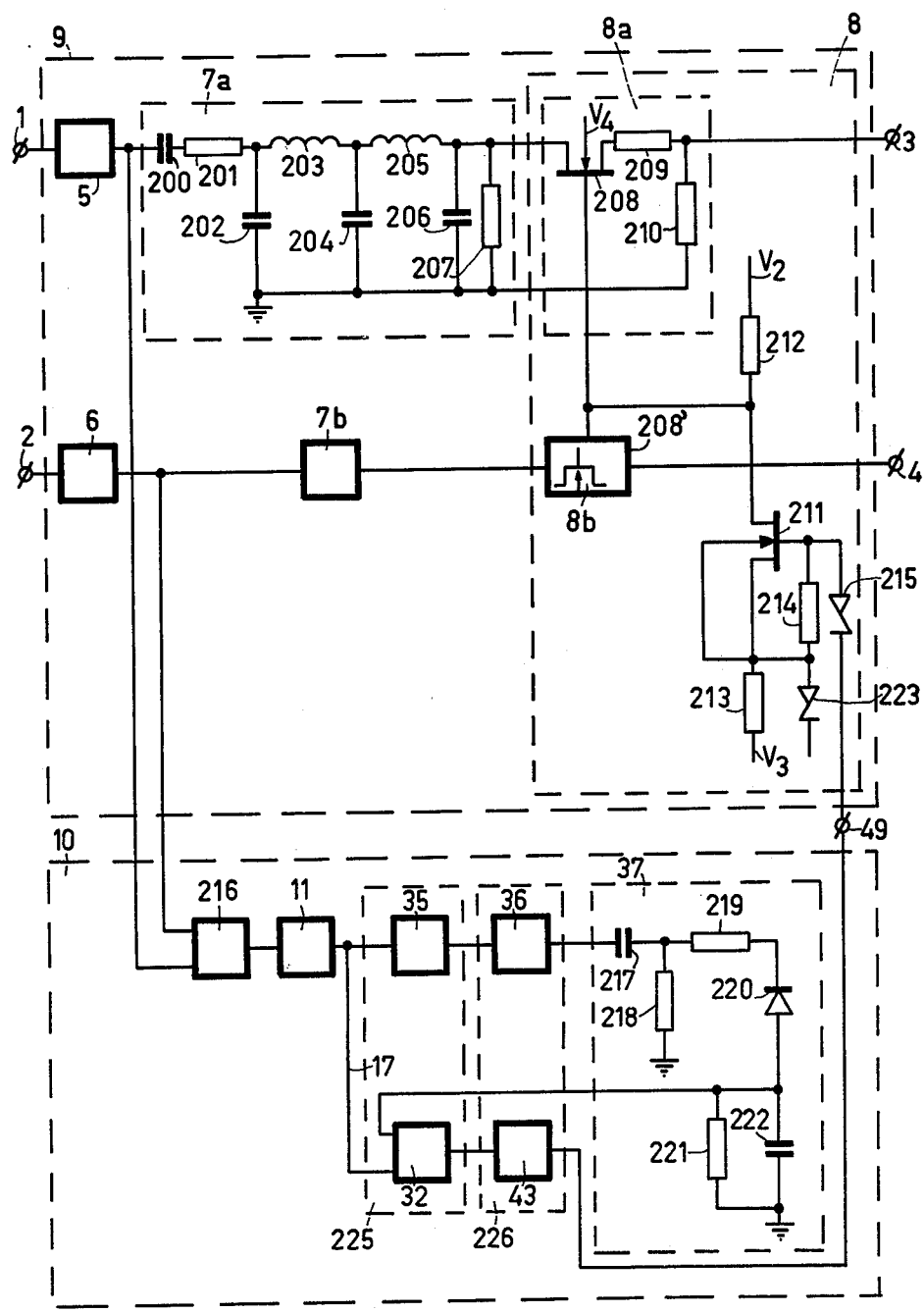
FIG. 4 shows a further practical implementation of a circuit according to the invention in which the audio signal is interrupted for a short, constant period of time at each interference.

FIG. 4 shows an other practical embodiment of a circuit according to the invention in which the components corresponding to the components of the circuit of FIG. 1 have been given the same reference numerals.

The stereo signal from which the noise is to be removed during the occurrence of noise is interrupted in the noise suppressor 8. To this end this noise suppressor 8 comprises an integrated MOSFET circuit of the type SD 5000, the MOSFET 208 and MOSFET 208', respectively, of which are included in an electronic switch 8a and 8b, respectively, MOSFET 211 being included in a control circuit for these electronic switches. The source electrode of the MOSFET 208 is connected to an output of the delay circuit 7a and the drain electrode to the output terminal 3 via a resistor 209. The substrate electrode thereof is connected to a voltage source V4 and the gate electrode to the drain electrode of the MOSFET 211. Output terminal 3 is connected to ground via a resistor 210. The electronic switch 8b is implemented in the same manner as the electronic switch 8a.

The MOSFET 211 is also connected, by means of its drain electrode, to a voltage source V2 via a resistor 212 and by means of its source electrode to a voltage source V3 via a resistor 213. The gate electrode thereof is connected on the one hand to the control input 49 of the noise suppressor 8 via a zener diode 215 and, on the other hand, to the supply electrode via a resistor 214. The supply electrode is connected directly to the substrate electrode. The control pulse required for switching is a square-wave pulse and can be generated in a simple manner. The delay time may, consequently, be short so that the delay circuits 7a and 7b can be of a simple construction and cheap to produce. The delay circuit 7a comprises a series arrangement, connected to the output of the pre-amplifier 5, of a capacitor 200 and a resistor 201. This series arrangement is coupled to an LC-ladder network, the series branch of which comprises a series arrangement of inductances 203 and 205, the parallel branches connected to ground comprising capacitors 202, 204, 206. A terminating resistor 207 is arranged in parallel with capacitor 206. The delay circuit 7b is equal to the delay circuit 7a. In a practical embodiment each of these delay circuits has a delay time of 40 $\mu$sec, their band width being 20 KHz.

Owing to the rather short delay time of 40 $\mu$sec an early detection is important to prevent a portion of the noise, caused by a scratch, from reaching the output 3,4 already before a signal interruption has been effected. Depending on the polarity of the difference signal L−R and R−L, respectively, the amplitude variation caused by the noise starts in this difference signal with either an increase in amplitude or a reduction in amplitude, or vice versa. Consequently, a detector adjusted to a certain threshold value may recognize each disturbance each time too late as being a disturbance, depending on the connection of the audio frequency inputs to the scanning element, not shown.

Therefore the control signal portion 10 comprises, connected to the outputs of the amplifiers 5 and 6, a full-wave rectifier 216 in which the difference signal is rectified. This full-wave rectifier 216 is implemented by means of an integrated circuit of the type MC 1458. The full-wave rectifier 216 is coupled to a compressor 11, implemented as an integrated circuit, of the type NE 570. The rectifier included therein has a time constant of approximately 2 msec. Via the connecting lead 17 the compressor 11 is coupled to a noise detector 32 which is connected to a monostable multivibrator 43. An output of this monostable multivibrator 43 is connected to the control input 49 of the noise suppressor 8. The pulse width of the output pulses of this monostable multivibrator 43 is 3 msec., the pulse amplitude is approximately 14 V. The automatic threshold circuit is constituted by an amplifier 35, provided with a threshold, coupled to a monostable multivibrator 36, and a pulse integrator 37. This pulse integrator 37 comprises a coupling capacitor 217 which is connected to ground via a resistor 218 and arranged in series with a resistor 219 and a diode 220 for negatively charging a capacitor 222. This capacitor 222 is discharged via a resistor 221 arranged in parallel with the capacitor 222.

The voltage across the capacitor 222 is a measure of the frequency of the pulses in the output signal of the compressor and constitutes a threshold voltage for the noise detector 32. A sequence of at least 5 to 6 pulses within 20 msec. causes the voltage across the capacitor 222 to fall to a substantially maximum negative value of approximately −10.5 V, so that subsequent pulses cannot be cause for activating the noise suppressor.

In practice, an integrated circuit of the type MC 1458 is used for implementing the noise detector 32 and the amplifier 35, provided with a threshold, and an integrated circuit of the type HEF 4528 for implementing the monostable multivibrators 36 and 43. The resistors and capacitors have the following values:

| Resistors | Value ($\Omega$) | Capacitors | Value (F) |
|---|---|---|---|
| 201 | 330 | 200 | 10$\mu$ |
| 207 | 680 | 202 | 22 n |
| 209 | 330 | 204 | 47 n |
| 210 | 330 | 206 | 22 n |
| 212 | 10K | 217 | 68$\mu$ |
| 213 | 270 | 222 | 6.8 $\mu$ |
| 214 | 22K | | |
| 218 | 39K | | |
| 219 | 1K5 | Inductances | Value (H) |
| 221 | 100K | 203 | 4.8 m |
| | | 205 | 4.8 m |

The Zener diode 215 is of the type C18, the Zener diode 223 of the type C10 and the diode 220 of the type BAW 62. The supply voltage V2 is +15 V, V3:−15 V and V4:−10 V.

What is claimed is:

1. A circuit for suppressing pulse-shaped noise in an audio signal caused by scratches on a phonograph disc, comprising an audio frequency input and an audio frequency output; a signal processing section, connected between said audio frequency input and said audio frequency output, including a noise suppressor having a control input; as well as a control signal section connected between the audio frequency input and the noise suppressor control input, said control signal section being provided with a first threshold selection circuit connected to the audio frequency input for selecting pulse-shaped signals from the audio signal and a second threshold selection circuit connected between the first threshold selection circuit and the control input of the noise suppressor for selecting the pulse-shaped noise from the pulse-shaped signals of the first threshold selection circuit, this second threshold selection circuit comprising to this end a converter and a noise detector having a threshold, said converter being arranged between the first threshold selection circuit and said noise detector, the converter converting a pulse frequency from said first threshold selection circuit into a d.c. voltage for varying, depending on the pulse frequency, the ratio between the amplitude of the pulse-shaped signals of the first threshold selection circuit and the threshold voltage of the noise detector whereby pulse-shaped signals occurring above a specified frequency, which is indicative of the desired pulse-shaped music, will cause said converter to provide a negative d.c. voltage to said noise detector thereby preventing said noise detector from being activated by said pulse-shaped signals, while pulse-shaped signals occurring below the specified frequency, which is indicative of pulse-shaped noise produced by, for example, scratches, will cause said converter to provide substantially no negative d.c. voltage to said noise detector thereby allowing said noise detector to be activated by said pulse-shaped signals.

2. A circuit as claimed in claim 1, wherein the d.c. voltage of the converter changes at a pulse frequency of at least 120 Hz lasting for at least 15 msec. from a quiescent level to an operating level and, in the absence of pulse-shaped signals for at least substantially 200 msec., changes exponentially from the operating level to the quiescent level, the noise detector having a maximum insensitivity to pulse-shaped signals at the operating level and the noise detector being activated at the quiescent level when a pulse-shaped signal is produced.

3. A circuit as claimed in claim 2, wherein the second threshold selection circuit further comprises a monostable multivibrator, connected between the first threshold selection circuit and the converter and having a time constant of at least substantially 2 msec. and the converter comprises a capacitor coupled via a series arrangement of a diode and a charging resistor to the monostable multivibrator, the RC-time of the capacitor and the charging resistor being at least substantially 5 msec., the capacitor being shunted by a discharge resistor and forming therewith an RC-time of at least substantially 0.1 msec.

4. A circuit as claimed in claim 3, wherein the output of the converter is connected to the base of a transistor of the noise detector, the converter for pulse-shaped signals being shunted by a connecting lead.

5. A circuit as claimed in claim 4, wherein the first threshold selectiion circuit comprises a level control circuit as well as a detector connected thereto, in which the detector has a threshold voltage and the level control circuit comprises a RC-control network having a time constant of at least substantially 3 msec. for controlling, in a mutually constant ratio, the dynamic range of the audio signal and the threshold voltage of the detector.

6. A circuit as claimed in claim 5, wherein the level control circuit comprises a dynamic compressor which includes the RC-control network for minimizing the amplitude variations of the audio signal owing to the dynamic range and wherein the threshold voltage of the detector has a constant value.

7. A circuit as claimed in claims 5 or 6, for suppressing pulse-shaped interferences in a stereo signal cuased by scratches on a stereophonic phonograph record wherein the audio frequency input comprises a first and a second input terminal and the audio frequency output comprises a first and a second output terminal and the control signal selection further comprises a differential amplifier connected to the two input terminals and an output of which is coupled to a signal input of the level control circuit and wherein the control signal section further comprises a sum amplifier connected on the one hand to the two input terminals and on the other hand to a control input of the level control circuit.

8. A circuit as claimed in claim 7, wherein the level control circuit further comprises a first controllable amplifier connected between the signal input and the detector having a threshold, and a second controllable amplifier connected to the control input, this second controllable amplifier being negatively fed back from an output terminal to a control input terminal via a full-wave rectifier and the RC-network, the control input terminal of the second controllable amplifier being connected to a control input terminal of the first controllable amplifier.

* * * * *